(12) United States Patent
Gambino et al.

(10) Patent No.: US 10,090,342 B1
(45) Date of Patent: Oct. 2, 2018

(54) STACKED IMAGE SENSOR CAPACITORS AND RELATED METHODS

(71) Applicant: SEMICONDUCTOR COMPONENTS INDUSTRIES, LLC, Phoenix, AZ (US)

(72) Inventors: Jeffrey Peter Gambino, Gresham, OR (US); Angel Rodriguez, San Jose, CA (US); David T. Price, Gresham, OR (US); Jeffery Allen Neuls, Beaverton, OR (US); Kenneth Andrew Bates, Happy Valley, OR (US); Rick Mauritzson, Meridian, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/665,677

(22) Filed: Aug. 1, 2017

(51) Int. Cl.
*H01L 27/146* (2006.01)
*H01L 21/06* (2006.01)
*H01L 27/06* (2006.01)

(52) U.S. Cl.
CPC .... *H01L 27/14609* (2013.01); *H01L 27/0617* (2013.01); *H01L 27/1463* (2013.01); *H01L 27/14634* (2013.01); *H01L 27/14636* (2013.01)

(58) Field of Classification Search
CPC ........... H01L 27/14609; H01L 27/0617; H01L 27/1463; H01L 27/14634; H01L 27/14636
See application file for complete search history.

(56) References Cited

U.S. PATENT DOCUMENTS

| 9,711,554 | B2 * | 7/2017 | Kwon | H01L 27/14636 |
| 2006/0146233 | A1 * | 7/2006 | Park | H01L 27/14634 349/95 |
| 2010/0238334 | A1 * | 9/2010 | Takahashi | H01L 27/14632 348/305 |
| 2015/0060968 | A1 * | 3/2015 | Sa | H01L 27/14609 257/292 |
| 2015/0303233 | A1 * | 10/2015 | Borthakur | H01L 27/14636 348/273 |

(Continued)

OTHER PUBLICATIONS

S. Velichko et al., "Low Noise High Efficiency 315 μm and 2.8 μm Global Shutter CMOS Pixel Arrays," IISW, 2013.
(Continued)

*Primary Examiner* — Karen Kusumakar
(74) *Attorney, Agent, or Firm* — IPTechLaw

(57) ABSTRACT

Implementations of image sensors may include a first die including an image sensor array and a first plurality of interconnects where the image sensor array includes a plurality of photodiodes and a plurality of transfer gates. The image sensor array may also include a second die including a second plurality of interconnects and a plurality of capacitors, each capacitor selected from the group consisting of deep trench capacitors, metal-insulator-metal (MIM) capacitors, polysilicon-insulator-polysilicon (PIP) capacitors, and 3D stacked capacitors. The first die may be coupled to the second die through the first plurality of interconnects and through the second plurality of interconnects. No more than eight photodiodes of the plurality of photodiodes of the first die may be electrically coupled with no more than four capacitors of the plurality of capacitors.

19 Claims, 11 Drawing Sheets

(56) References Cited

U.S. PATENT DOCUMENTS

2017/0221950 A1* 8/2017 Ho .................... H01L 27/14625

OTHER PUBLICATIONS

G. Meynants, "Global Shutter Image Sensors," Solid State Tech., 2014.
T. Rajeevkumar et al., "Trench Storage Capacitors for High Density DRAMs," IEDM, 1991.
L. Nesbit et al., "A 0.6 um2 256Mb Trench DRAM Cell With Self-Aligned BuriEd STrap (BEST)," IEDM, 1991.
Mick, Jason, "Coalition of 20+ Tech Firms Backs MRAM as Potential DRAM, NAND Replacement," DailyTech Blog, available online at http://www.dailytech.com/Coalition+of+20+Tech+Firms+Backs+MRAM+as+Potential+DRAM+NAND+Replacement/article33826.htm.
"Panasonic Develops Industry-First 123dB Simultaneous-Capture Wide-Dynamic-Range Technology using Organic-Photoconductive-Film CMOS Image Sensor," Panasonic Headquarters News, Feb. 3, 2016, available at http://news.panasonic.com/global/press/data/2016/02/en160203-5/en160203-5.html.
"Multilevel Wafer Stacking for 3D Circuit Integration," Technology Today, 2015, issue 1, p. 30, available at http://www.raytheon.com/news/technology_today/2015_i1/wafer.html.
Illustrations and pictures by G. Deptuch, 2009.

* cited by examiner

STACKED IMAGE SENSOR CAPACITORS AND RELATED METHODS

BACKGROUND

1. Technical Field

Aspects of this document relate generally to image sensors. More specific implementations involve stacked image sensors that contain capacitors.

2. Background

Image sensors convey information related to an image by communicating signals in response to incident electromagnetic radiation. Image sensors are used in a variety of devices including smart phones, digital cameras, night vision devices, medical imagers, and many others. Varying image sensors need varying dynamic range capacities based on the specific incident electromagnetic radiation.

SUMMARY

Implementations of image sensors may include a first die including an image sensor array and a first plurality of interconnects, the image sensor array including a plurality of photodiodes and a plurality of transfer gates. The image sensor array may also include a second die including a second plurality of interconnects and a plurality of capacitors, each capacitor selected from the group consisting of deep trench capacitors, metal-insulator-metal (MIM) capacitors, polysilicon-insulator-polysilicon (PIP) capacitors, and 3D stacked capacitors. The first die may be coupled to the second die through the first plurality of interconnects and through the second plurality of interconnects. No more than eight photodiodes of the plurality of photodiodes of the first die may be electrically coupled with no more than four capacitors of the plurality of capacitors.

Implementations of the image sensors may include one, all, or any of the following:

Each photodiode of the first die may be electrically coupled to only one capacitor of the plurality of capacitors.

Each capacitor may have a total capacitance of at least 100 fF.

Each capacitor may have a density of at least 25 fF/$\mu m^2$.

Implementations of image sensors may include a photodiode die including an image sensor array having a plurality of photodiodes, and a plurality of transfer gates. The image sensor may also include a pixel device die having a first side and a second side, the first side bonded to the pixel array die, the pixel device die including a plurality of capacitors selected from the group consisting of deep trench capacitors, MIM capacitors, PIP capacitors, and 3D stacked capacitors, and a digital signal processor (DSP) die bonded to the second side of the pixel device layer. A through silicon via (TSV) electrically may couple the pixel device die with the DSP die. No more than eight photodiodes of the plurality of photodiodes of the first die may be electrically coupled with no more than four capacitors of the plurality of capacitors.

Implementations of the image sensors may include one, all, or any of the following:

Each photodiode of the first die may be electrically coupled to only one capacitor of the plurality of capacitors.

Each capacitor may have a total capacitance of at least 100 fF.

The plurality of capacitors may be deep trench capacitors and each photodiode may be electrically coupled to a first deep trench capacitor for a signal value and a second deep trench capacitor for a reference value.

The plurality of capacitors may be deep trench capacitors and the pixel device die may further include a base oxide layer contacting a terminal end of each deep trench capacitor.

The plurality of capacitors may be deep trench capacitors and at least a portion of the TSV may be wider than each deep trench capacitor.

Each capacitor may have a density of at least 25 fF/$\mu m^2$.

The photodiode die may be hybrid bonded to the pixel device die and the pixel device die may be fusion bonded to the DSP die.

The photodiode die may be hybrid bonded to the pixel device die and the pixel device die may be hybrid bonded to the DSP die.

Implementations of image sensors may include a photodiode die including an image sensor array having a plurality of photodiodes, and a plurality of transfer gates. The image sensor may also include a pixel device die including a first side and a second side, the first side bonded to the pixel array die, the pixel device die having a plurality of deep trench capacitors, and a digital signal processor (DSP) die bonded to the second side of the pixel device layer. A through silicon via (TSV) may electrically couple the pixel device die with the DSP die. No more than eight photodiodes of the plurality of photodiodes of the photodiode die may be electrically coupled with no more than four deep trench capacitors.

Implementations of the image sensors may include one, all, or any of the following:

The pixel device die may further include a base oxide layer contacting a terminal end of each deep trench capacitor.

At least a portion of the TSV may be wider than each deep trench capacitor.

Each capacitor may have a density of at least 25 fF/$\mu m^2$.

The TSV may be a polysilicon filled TSV.

The TSV may narrow from the pixel device die to the DSP die.

The TSV may widen from the pixel device die to the DSP die.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended image sensors will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such image sensors, and implementing components and methods, consistent with the intended operation and methods.

Figure 1:
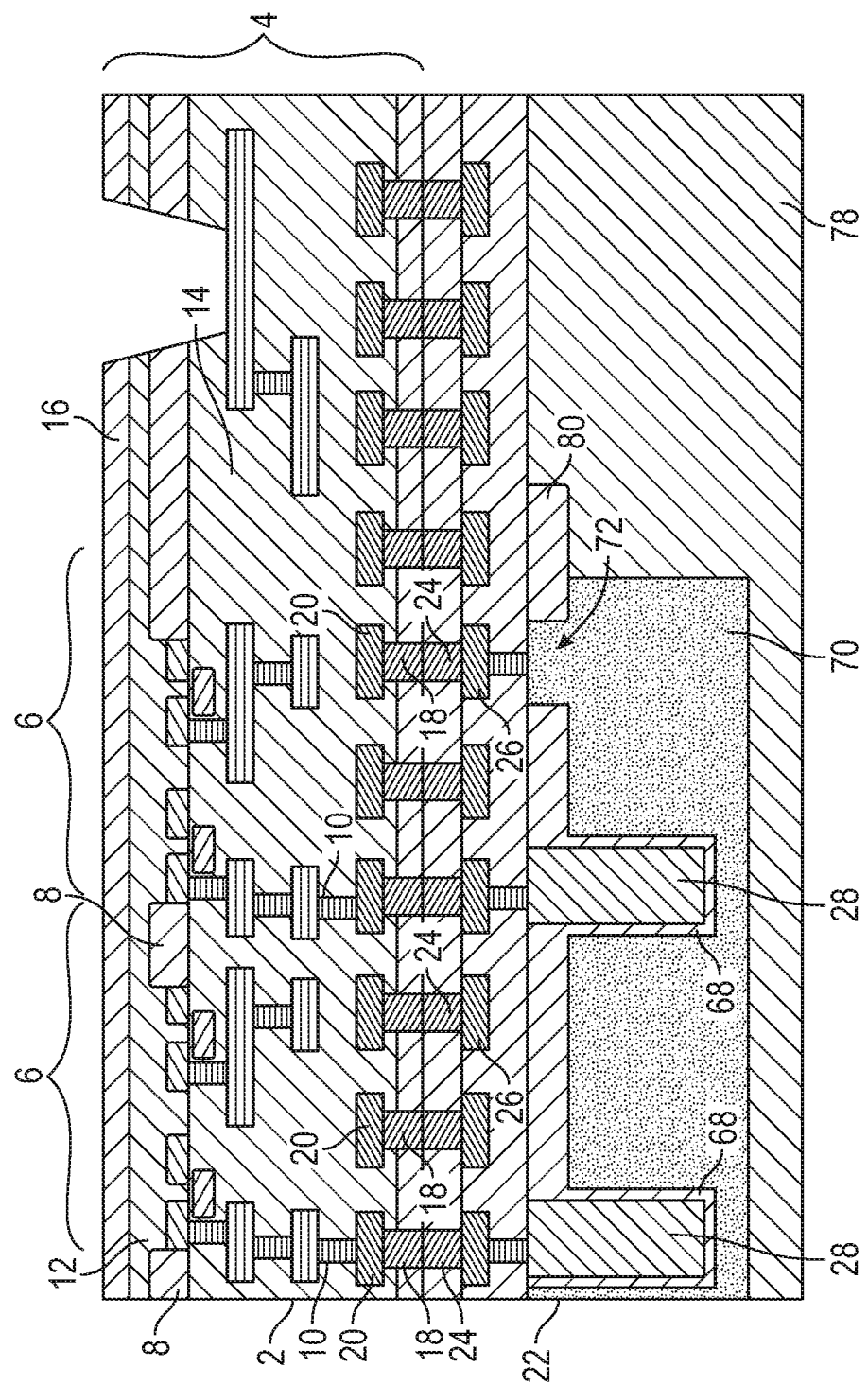
FIG. 1 is a front cross sectional view a two die stacked image sensor.

Referring to FIG. 1, a front cross sectional view of a two die stacked image sensor is illustrated. In various implementations, the image sensor may be a complimentary metal-oxide-semiconductor (CMOS) image sensor. The image sensor includes a first die 2. The first die includes an image sensor array 4. The image sensor array 4 may include a plurality of photodiodes 6. The photodiodes may vary in size. A plurality of shallow trench isolation features 8 separate and isolate the photodiodes within the plurality of photodiodes 6. In various implementations, the photodiodes may be partially encompassed by a silicon layer 12 and partially encompassed by a silicon dioxide (SiO$_2$) layer 14. The image sensor array 4 may also include a plurality of transfer gates 10 coupled to the plurality of photodiodes 6 and a plurality of associated pixel devices.

In various implementations, the first die also includes an anti-reflective coating 16 on an exposed surface of the first die. The first die includes a first plurality of vertical, die-to-die interconnects 18. The first plurality of interconnects are coupled to the plurality of transfer gates 10. The first plurality of interconnects 18 may include, by non-limiting example, copper, gold, silver, aluminum, tin, any combination thereof, or any other electrically conductive material. A first plurality of landing pad interconnects 20 are coupled to each interconnect within the plurality of first interconnects. In various implementations, the first plurality of interconnect caps may be aluminum, while in other implementations the first plurality of caps may be any other conductive material.

The image sensor includes a second die 22 coupled to the first die 2. The second die includes a second plurality of vertical, die-to-die interconnects 24. The second plurality of interconnects may include, by non-limiting example, copper, gold, silver, aluminum, tin, any combination thereof, or any other electrically conductive material. The second plurality of interconnects 24 may be coupled to the first plurality of interconnects 18. A second plurality of landing pad interconnects 26 may be coupled to each interconnect within the plurality of second interconnects. In various implementations, the second plurality of caps may be aluminum, while in other implementations the second plurality of caps may be any other electrically conductive material, such as copper.

In various implementations, the second die includes a plurality of capacitors 28. In various implementations, each photodiode of the plurality of photodiodes is electrically coupled to only one capacitor, while in other implementations, each photodiode is electrically coupled to only two capacitors. In still other implementations, however, each photodiode is electrically coupled to more than two capacitors.

In various implementations each capacitor of the plurality of capacitors 28 may be utilized as a floating diffusion region, as a storage node, or as both. In various implementations each capacitor of the plurality of capacitors may have hold, sample, and overflow functions. In various implementations, as illustrated by FIG. 1, deep trench capacitors, which provide a high capacitance density, may be used. Deep trench capacitors occupy silicon device area and therefore result in a large layout area penalty if used in the image sensor array. By placing the deep trench capacitors in a separate die, high capacitance can be achieved without using layout area in the photodiode array.

In various implementations each capacitor has a capacitance of at least 100 fF. This capacitance value may reduce KT/C noise and may facilitate the function of image sensors with a high dynamic range and global shutter image sensors. In various implementations each capacitor may have a capacitance density of at least 25 fF/$\mu$m$^2$. In various implementations, the capacitors like those disclosed herein which are used in high dynamic range image sensors may have no capacitance mismatch or low capacitance mismatch.

Figure 2:
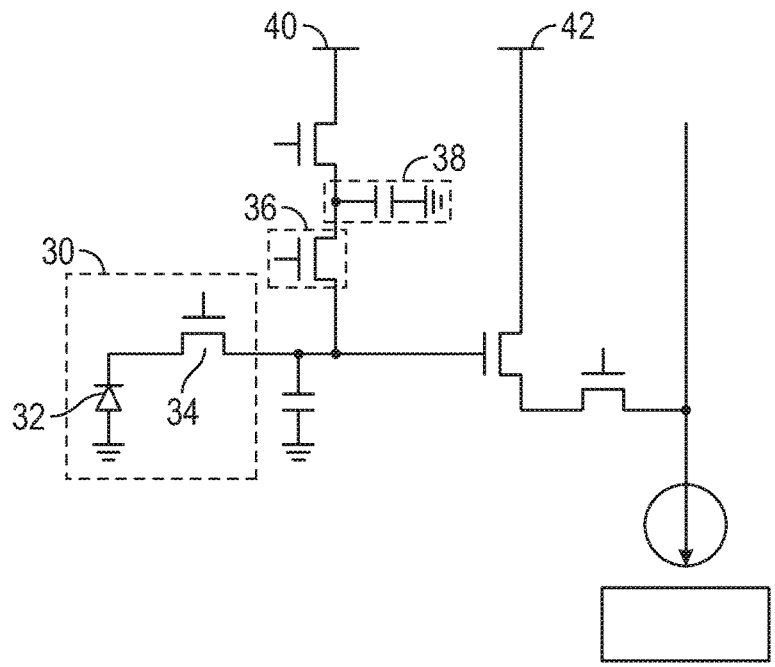
FIG. 2 is a circuit diagram for a pixel layout utilizing a single capacitor to increase dynamic range.

Referring to FIG. 2, a circuit diagram for a pixel layout utilizing a single capacitor to increase dynamic range is illustrated. The circuit illustrated in FIG. 2 may include a first chip 30. The first chip includes a photodiode 32 and a transfer region 34. The circuit also includes a gain control region 36, a capacitor 38, a first drain supply 40, and a second drain supply 42. In various implementations, and as illustrated in FIG. 2, when a pixel is operated in low conversion gain, excess charge from the photodiode 32 may be stored in the capacitor 38. In a standard complementary metal oxide semiconductor (CMOS) image sensor pixel, the excess charge from the photodiode would normally be lost. The capacitor 38 saves the charge which can then be used to increase the pixel dynamic range. While in the circuit illustrated in FIG. 2, only a single capacitor 38 is paired with the photodiode structure 30, depending on how the read out circuitry is designed in various image sensor implementations, various ratios of photodiodes to capacitors may be used in various implementations. For example, up to eight photodiodes could be operatively coupled to up to four capacitors in various implementations. In some implementations, a single photodiode may be coupled with up to four capacitors; in others, up to eight photodiodes could be operatively coupled with a single capacitor. The arrangement and ratio of photodiodes to capacitors is determined 1) by the operational characteristic of the capacitor itself (dynamic range, etc.) and 2) the desired read out circuit arrangement used to retrieve and process the signal from each photodiode.

Figure 3:
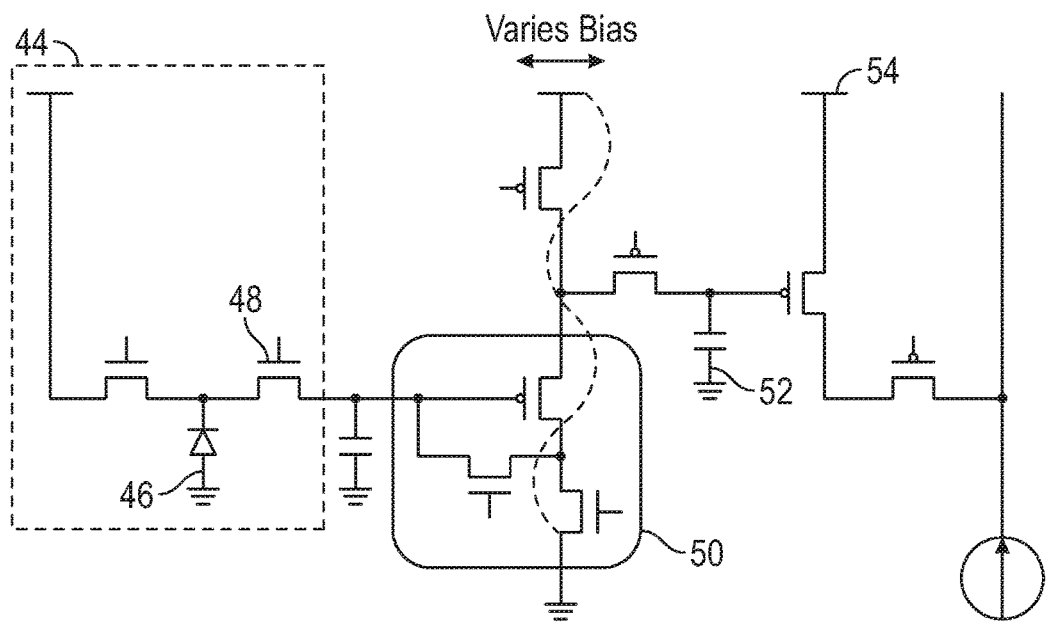
FIG. 3 is a circuit diagram for a pixel layout utilizing a capacitor to store a sampled signal.

Referring to FIG. 3, a circuit diagram for a pixel layout utilizing a capacitor to store a sampled signal is illustrated. The circuit includes, as illustrated in FIG. 3, a first chip 44.

The first chip 44 includes a photodiode 46 and a transfer gate 48. The circuit also includes an active pixel reset region 50, a capacitor 52 and a drain source 54. In various implementations, the capacitor 52 may store the sampled signal so that correlated double sampling can be done inside the pixel. Correlated double sampling is a noise reduction technique in which the reference voltage of the pixel (i.e., the pixel's voltage after it is reset) is removed from the signal voltage of the pixel (i.e., the pixel's voltage at the end of the integration) at the end of each integration period.

Figure 4:
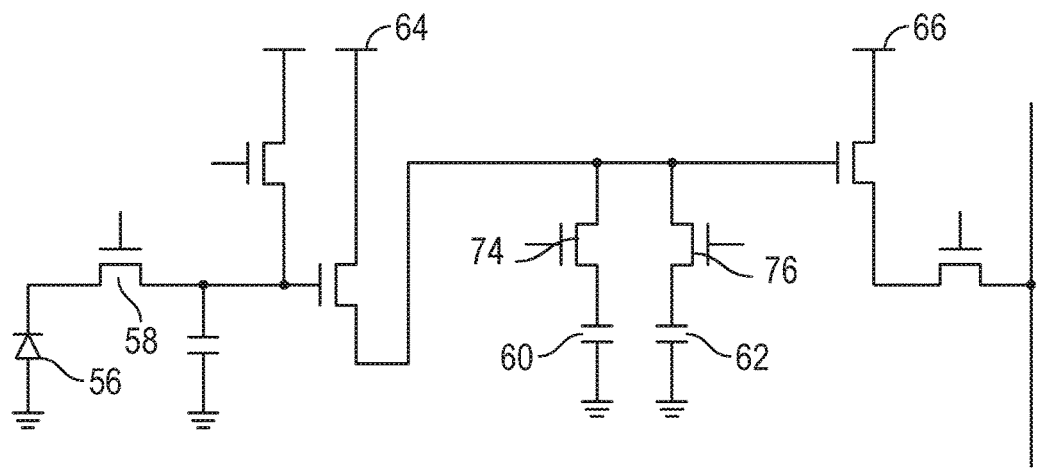
FIG. 4 is a circuit diagram for a pixel layout with two capacitors.

Referring now to FIG. 4, a circuit diagram for a pixel layout with two capacitors is illustrated. The circuit includes, as illustrated in FIG. 4, a photodiode 56, a transfer gate 58, a first capacitor 60, a second capacitor 62, a first drain source 64, a second drain source 66, a first sampling region 74 and a second sampling region 76. In various implementations, the device may include sampling capacitors, samplings FETS, or both sampling capacitors and sampling FETS. In various implementations the photodiode 56 convey a charge through the transfer gate which is then stored in the first capacitor 60 and in the second capacitor 62. The charge can then be transferred from the capacitors and eventually processed by a digital signal processor, which is not illustrated in FIG. 4. Depending on the processing of the digital signal process, the charge may first be transferred from the first capacitor 60 and then from the second capacitor 62, or may be drawn from both. The process of drawing the charge is done using various circuit components that connect each pixel in the array together. As previously discussed, depending on the desired function of the capacitor and the read out circuitry design for the image sensor, up to eight photodiodes may be coupled with up to four capacitors. In the implementation illustrated in FIG. 4, additional capacitors could be included, up to two additional capacitors for the single photodiode. Furthermore, additional photodiodes could be coupled to the circuit and read out in various orders as designed by the read out circuitry for the image sensor. A wide variety of possibilities can be devised by a person of ordinary skill using the principles disclosed in this document.

In various implementations, the capacitors of the image sensor illustrated in FIG. 1 may be, by non-limiting example, deep trench capacitors, metal-insulator-metal (MIM) capacitors, polysilicon-insulator-polysilicon (PIP) capacitors, 3D stacked capacitors, and PIP on metal-oxide semiconductor (MOS) capacitors. Referring back to FIG. 1, the plurality of capacitors 28 illustrated there are deep trench capacitors. The deep trench capacitors 28 may be formed through a reactive ion etching (ME) process. The plurality of capacitors may include N+ polysilicon material as illustrated in FIG. 1. In other implementations the capacitors may be filled with material that has another doping depending on the material of the substrate in which the capacitor is formed. The plurality of capacitors may be at least partially coated in a coating 68 such as, by non-limiting example, silicon dioxide, silicon nitride, and high dielectric constant K. In various implementations the plurality of capacitors, and the associated coverings, may extend into an N+ buried plate 70, where the buried plate is in a p-substrate, 78. The buried plate 70 may include a common bottom plate contact 72 coupled to an interconnect of the second plurality of interconnects 24. The buried plate may contact a P– silicon layer 78. In various implementations, a shallow trench isolation feature 80 may be between the buried plate 70 and the P– silicon layer 78 at a junction of the buried plate and P– silicon layer. In various implementations, the buried plate (not shown) may be, by non-limiting example, (1) a p+ buried plate in an n– substrate, (2) an N+ substrate without additional buried plate doping (the substrate acts as the buried plate) or (3) a P+ substrate without additional buried plating doping.

Figure 5:
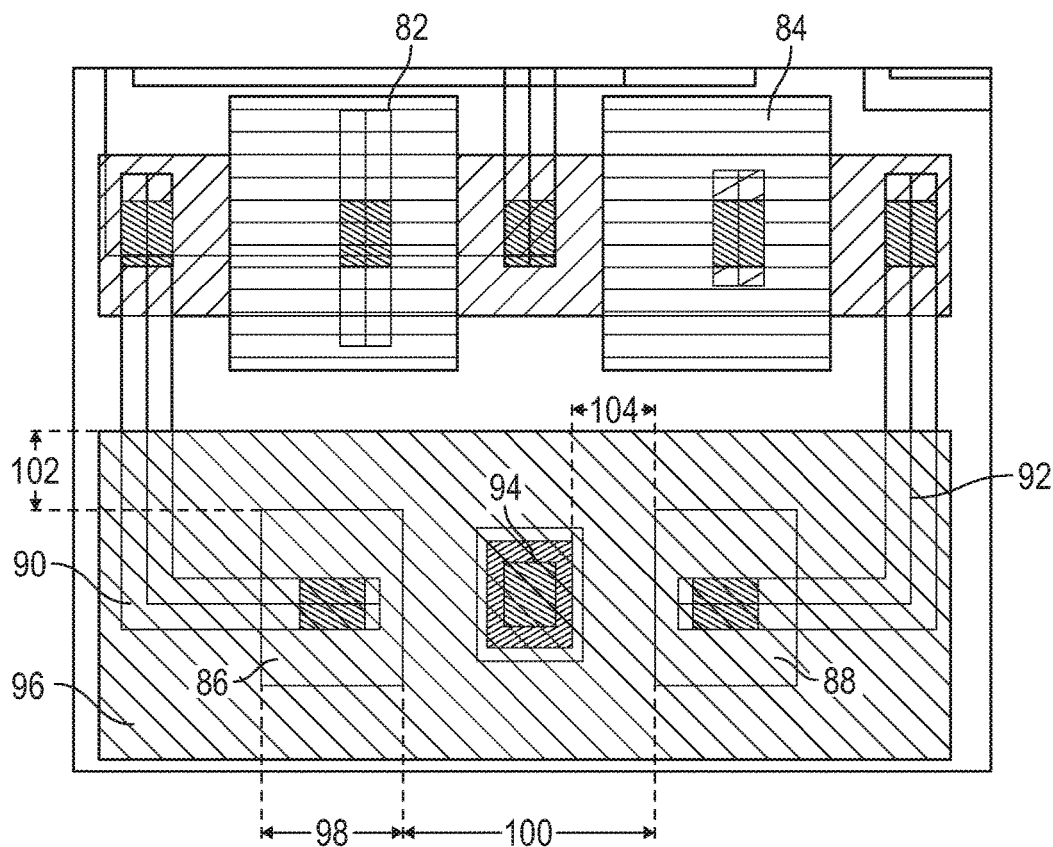
FIG. 5 is a schematic of a trench capacitor layout in one pixel of a stacked image sensor.

Referring to FIG. 5, a schematic of a trench capacitor layout in one pixel of a stacked image sensor is illustrated. The stacked image sensor may include a first sampling FET 82, a second sampling FET 84, a first deep trench capacitor 86, and a second deep trench capacitor 88. The first sampling FET 82 may be coupled to the first deep trench capacitor 86 through a first connection 90. The second sampling FET 84 may be coupled to the second deep trench capacitor 88 through a second connection 92. The deep trench capacitors may be in an N well 96. An N well contact may exist between the first deep trench capacitor 86 and the second deep trench capacitor 88. The buried plate (not shown) may connect to the n well.

The dimensions of the components illustrated in FIG. 5 may vary. In one implementation, width 98 of each trench is about 0.25 µm on each side. The space 100 between the two trenches may be about 0.45 µm. The space 102 between the edge of the deep trench capacitors and the edge of the N well 96 may be about 0.115 µm. The space 104 between the deep trench capacitors and the edge of the N well contact 94 may be about 0.15 µm. The capacitance density of the capacitors illustrated in FIG. 5 may be about 25 µm². The trench depth may be about 5 µm into a second wafer. The total capacitor area may be about 4 µm² and there may be a total capacitance of about 100 fF. In various implementations with high dynamic range image sensors, about 100 fF may lead to 115 dB in signal control/enhancement.

Figure 6:
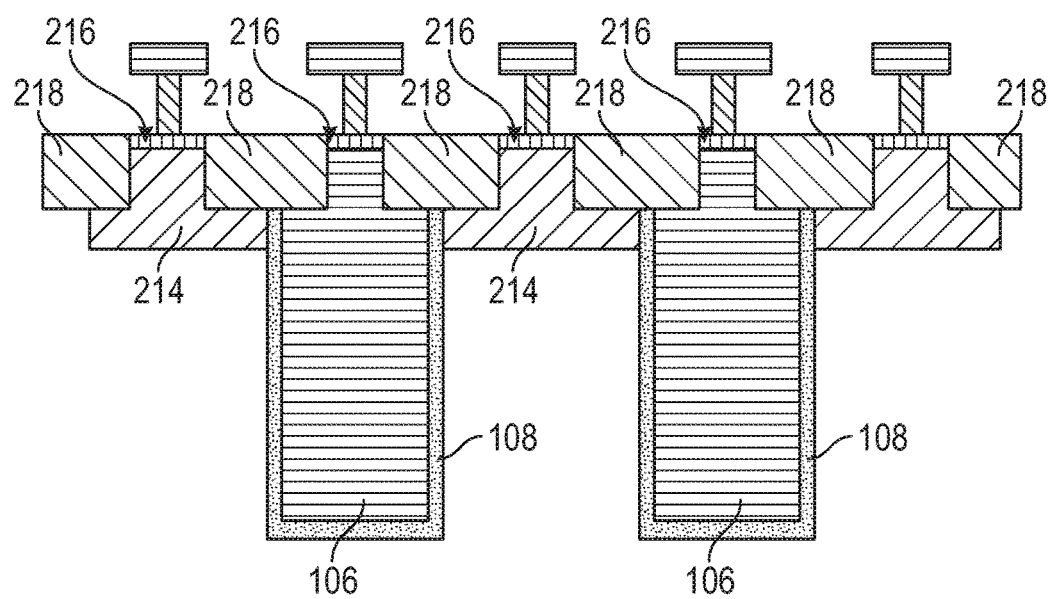
FIG. 6 is a front cross sectional view of deep trench capacitors within a stacked image sensor.

Referring now to FIG. 6, a front cross sectional view of deep trench capacitors within a stacked image sensor is illustrated. The image sensor may include a plurality of deep trench capacitors 106. As illustrated, the deep trench capacitors may include a N+ polysilicon material. However, depending on the doping of the substrate material, the deep trench capacitors may include a P doped material. The deep trench capacitors may be surrounded by a N+ buried plate.

The image sensor may include a plurality of N well regions 214. The N well regions connect to the buried plate that surrounds the deep trench capacitors 106. The image sensor may include an N+ implant region 216 at the top of each capacitor and N well region. In various implementations, a plurality of shallow trench isolation features 218 separate each N+ implant region from one another and extends into both an N well region and a capacitor.

Figure 7:
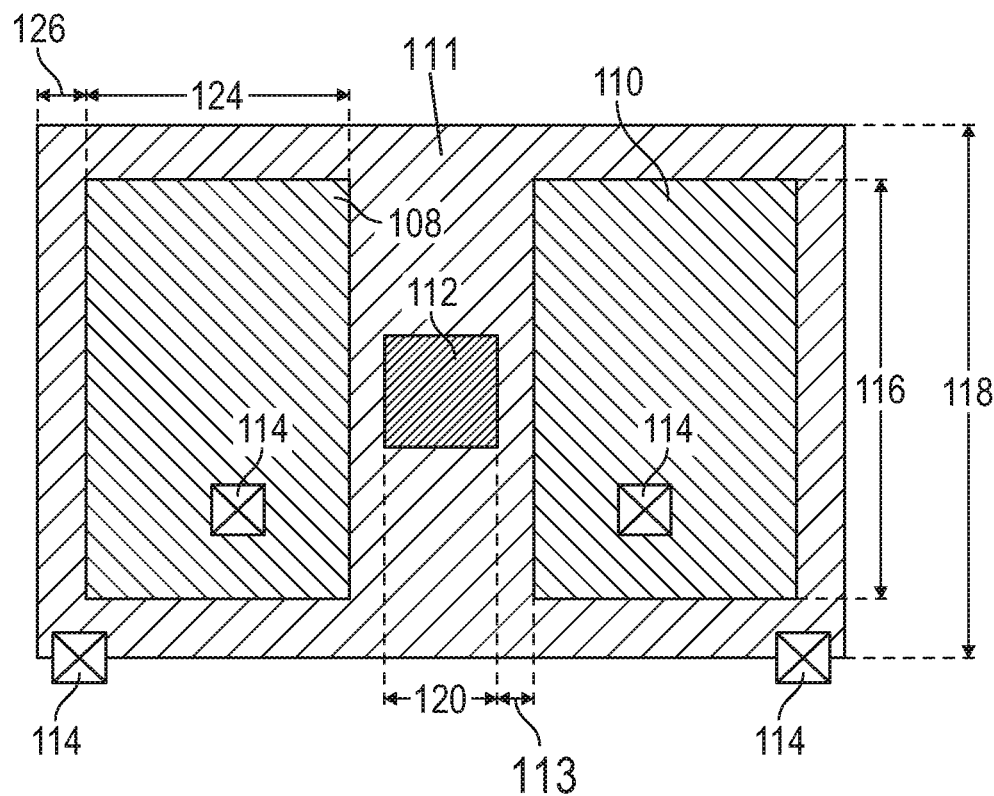
FIG. 7 is a schematic of a MIM capacitor.

Referring to FIG. 7, a schematic of a MIM capacitor is illustrated. The MIM capacitor may include a first plate 108 and a second plate 110 surrounded by an insulator. The MIM capacitor may also include a plurality of vias 114 and a bottom plate contact (BPC).

MIM capacitors often have a capacitance of less than 100 fF. A greater capacitance is attainable by doing, by non-limiting example, increasing the pixel pitch, double stacking MIM capacitors, providing a thinner dielectric, or utilizing a dielectric with a higher dielectric constant K.

Referring back to FIG. 7, a plurality of different dimensions are given that would allow a MIM capacitor to have a total capacitance of about 100 fF. In one implementation, the height 116 of the first plate 108 and the second plate 110 is about 4.2 µm and the width 124 of each plate is about 1.8 µm, giving an area of about 7.56 µm². The height 118 as well as the width of the common bottom plate 111 may be about 4.4 µm. The distance 126 between the plates and the edge of the common bottom plate 111 may be about 0.1 µm. The width 120 of the BPC 112 may be about 0.4 µm, and the distance 113 between the plates and the BPC 112 may be about 0.1 µm. While the total capacitance is about 100 fF using these dimensions, the capacitor's density may be more or less than about 25 µm².

Figure 8:
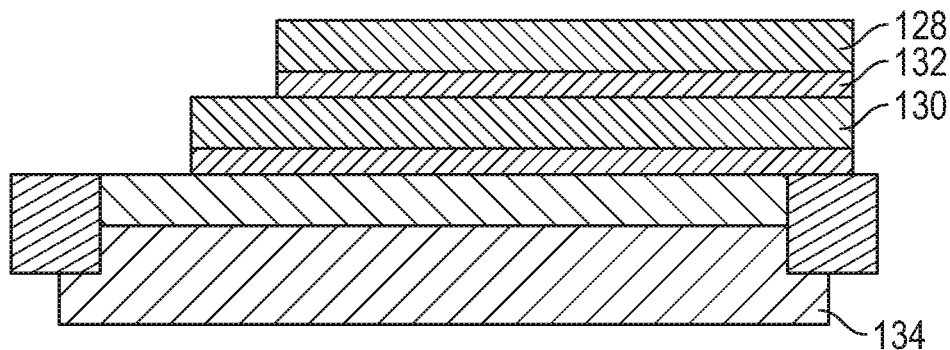
FIG. 8 is a front cross sectional view of PIP on MOS capacitor.

Referring now to FIG. 8, a front cross sectional view of PIP on MOS capacitor is illustrated. Similar to MIM capacitors, PIP capacitors often have a total capacitance of less than about 100 fF and a density less than about 25 µm². The capacitor in FIG. 8 may include a first polysilicon layer 128 and a second polysilicon layer 130. An insulator 132 may be coupled between the first and second polysilicon layer. The PIP capacitor may be coupled to a metal-oxide semiconductor 134.

In various implementations of devices disclosed in this document, in order to achieve a total capacitance of about 100 fF, the pixel pitch needs to be greater than about 5.3 µm.

Figure 9:
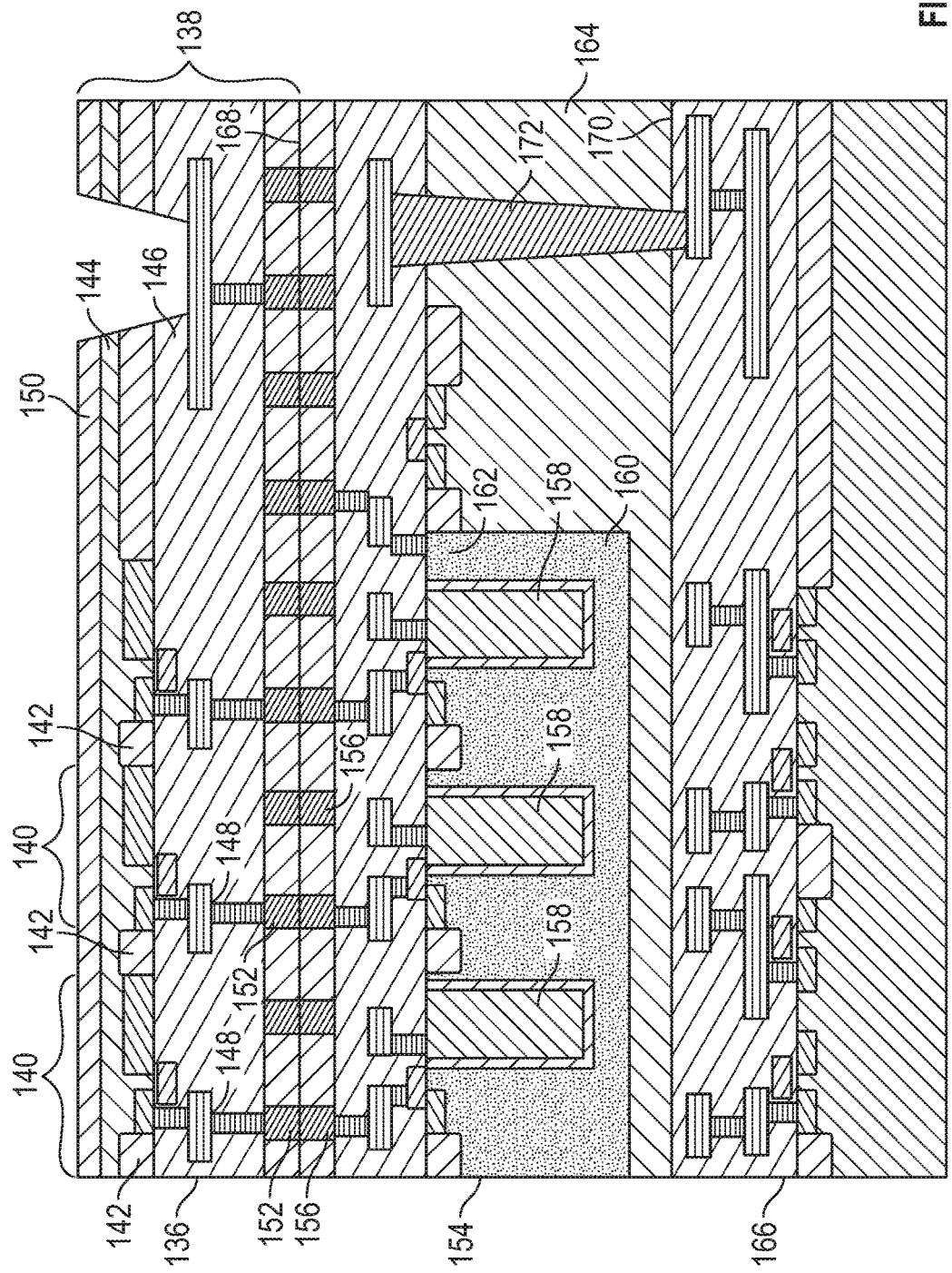
FIG. 9 is a front cross sectional view of a three die stacked image sensor.

Referring now to FIG. 9, a front cross sectional view of a three die stacked image sensor is illustrated. In various implementations, the image sensor may be a complimentary metal-oxide-semiconductor (CMOS) image sensor. The image sensor includes a photodiode die 136. The photodiode die may include an image sensor array 138.

The image sensor array 138 includes a plurality of photodiodes 140 which may vary in size. A plurality of shallow trench isolation features 142 may separate and isolate the photodiodes within the plurality of photodiodes 140. In various implementations, the photodiodes may be partially encompassed by a silicon layer 144 and partially encompassed by a silicon dioxide ($SiO_2$) layer 146. The image sensor array 138 also includes a plurality of transfer gates 148 coupled to the plurality of photodiodes 140.

In various implementations, the photodiode die also includes an anti-reflective coating 150 on an exposed surface of the first die. The photodiode die also includes a first plurality of interconnects 152. The first plurality of interconnects are coupled to the plurality of transfer gates 148. The first plurality of vertical, die-to-die interconnects 152 may include, by non-limiting example, copper, gold, silver, aluminum, tin, any combination thereof, or any other electrically conductive material. In various implementations, a first plurality of interconnect caps may be coupled to each interconnect within the plurality of first interconnects, while in other implementations, the image sensor does not include such caps.

The image sensor also includes a pixel device die 154. The pixel device die has a first side 168 and a second side 170 where the first side 168 is coupled to the first die 136. The pixel device die 154 includes a second plurality of vertical, die-to-die interconnects 156. The second plurality of interconnects may include, by non-limiting example, copper, gold, silver, aluminum, tin, any combination thereof, or any other electrically conductive material. The second plurality of interconnects 156 are coupled to the first plurality of interconnects 152. In various implementations a second plurality of interconnect caps may be coupled to each interconnect within the plurality of second interconnects, while in other implementations, the image sensor does not include such caps.

In various implementations, the pixel device die includes a plurality of capacitors 158. In various implementations, each photodiode of the plurality of photodiodes is electrically coupled to only one capacitor, while in other implementations each photodiode is electrically coupled to only two capacitors. In still other implementations each photodiode is electrically coupled to more than two capacitors. The plurality of capacitors 158 may be of any type of capacitor disclosed herein and may perform any function disclosed herein.

The plurality of capacitors 158, as illustrated in FIG. 9, may be deep trench capacitors. In various implementations, the plurality of capacitors may include N+ polysilicon material, though they be doped with other materials depending on the doping of the substrate. The plurality of capacitors may be at least partially coated in a coating 160 such as, by non-limiting example, silicon dioxide, silicon nitride, and other materials with a high dielectric constant K. In various implementations, the plurality of capacitors, and the associated coverings, may extend into a N+ buried plate 160. The buried plate 160 may include a common bottom plate contact 162 coupled to an interconnect of the second plurality of interconnects 156. The buried plate may contact a P-silicon layer 164 in various implementations. In other implementations, the buried plate may be any type of buried plate previously disclosed herein.

The image sensor includes a digital signal processor die 166 bonded to the second side 170 of the pixel device die 154. The image sensor also includes a through silicon via (TSV) 172. In various implementations the TSV may electrically couple the pixel device die 154 with the digital signal processing die 166. In other implementations, the TSV may electrically couple the photodiode die 136, the pixel device die 154, and the digital signal processing die 166 together. In various implementations, the TSV 172 may be have a constant width through the entire length of the TSV. In other implementations, the TSV may narrow from the pixel device die to the digital signal processing die. The TSV 172 may include a portion with a width greater than the width of a capacitor from the plurality of capacitors 158. The TSV 172 may include, by non-limiting example, tungsten, copper, doped-polysilicon, or any other electrically conductive material.

Figure 10:
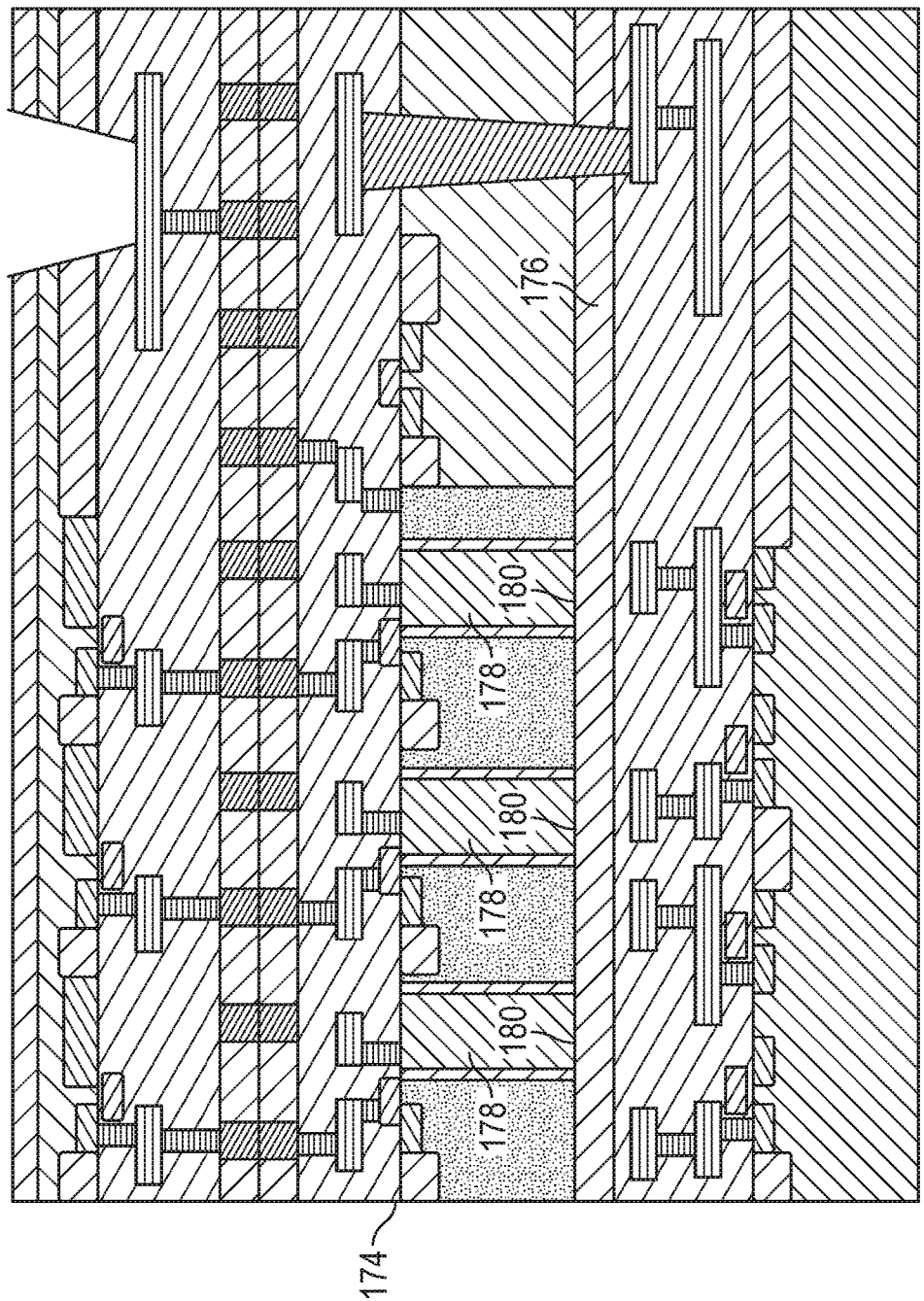
FIG. 10 is a front cross sectional view of a three die stacked image sensor with a base oxide layer.

Referring now to FIG. 10, a front cross sectional view of a three die stacked image sensor with a base oxide layer is illustrated. The image sensor of FIG. 10 may be similar to or the same as the image sensor of FIG. 9, with the difference that the image sensor of FIG. 10 includes a silicon-oxide insulator substrate. As illustrated in FIG. 10, the pixel device die 174 include base-oxide layer 176. The base-oxide layer 176 contacts the terminal ends 180 of a plurality of deep trench capacitors 178. As such, the base-oxide layer 176 serves as an etch stop during the formation process for the plurality of deep trench capacitors 178.

Figure 11:
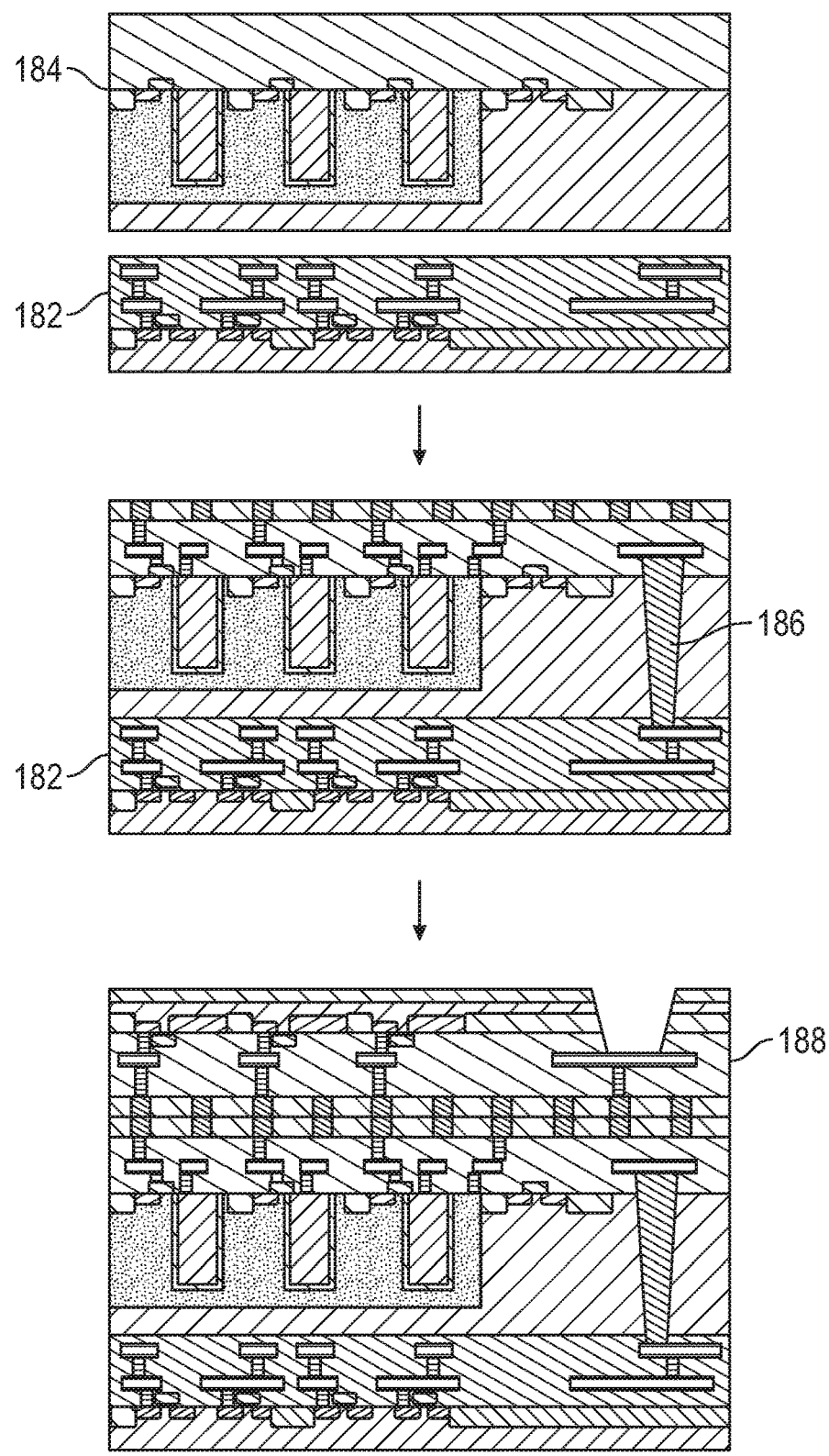
FIG. 11 illustrates a process flow for forming the image sensor of FIGS. 9 and 10.

Referring to FIG. 11, a process flow for forming the image sensor of FIGS. 9 and 10 is illustrated. First, a fully formed digital signal processor 182 is bonded to a thinned pixel device die 184. The pixel device die may be fully formed or only partially formed when bonded. In various implementations the digital signal processor die 182 is hybrid bonded (Cu—Cu bonding of the vias and oxide-oxide bonding in between the vias) to the pixel device die, while in other implementations the digital signal processer die 182 may be fusion bonded (oxide-oxide bonding) to the pixel device die 184 using oxide or metal layers. In implementations where the pixel device die 184 is partially formed and is bonded to the digital signal processor die 182, the pixel device die 184 is then fully formed after being bonded.

A TSV 186 is then formed from the frontside of the pixel device die, and may be between the pixel device die and the digital signal processor die 182. The TSV electrically couples these two die. A fully processed photodiode die 188 is then bonded to the pixel device die 184. In various implementations, the photodiode die 188 is hybrid bonded to the pixel device die 184 (Cu—Cu bonding of the vias and oxide-oxide bonding in between the vias). At this point, with the three die, the photodiode die 188, the pixel device die 184, and the digital signal processor die 182 bonded and electrically coupled together, the stacked image sensor is ready for subsequent packaging operations.

Figure 12:
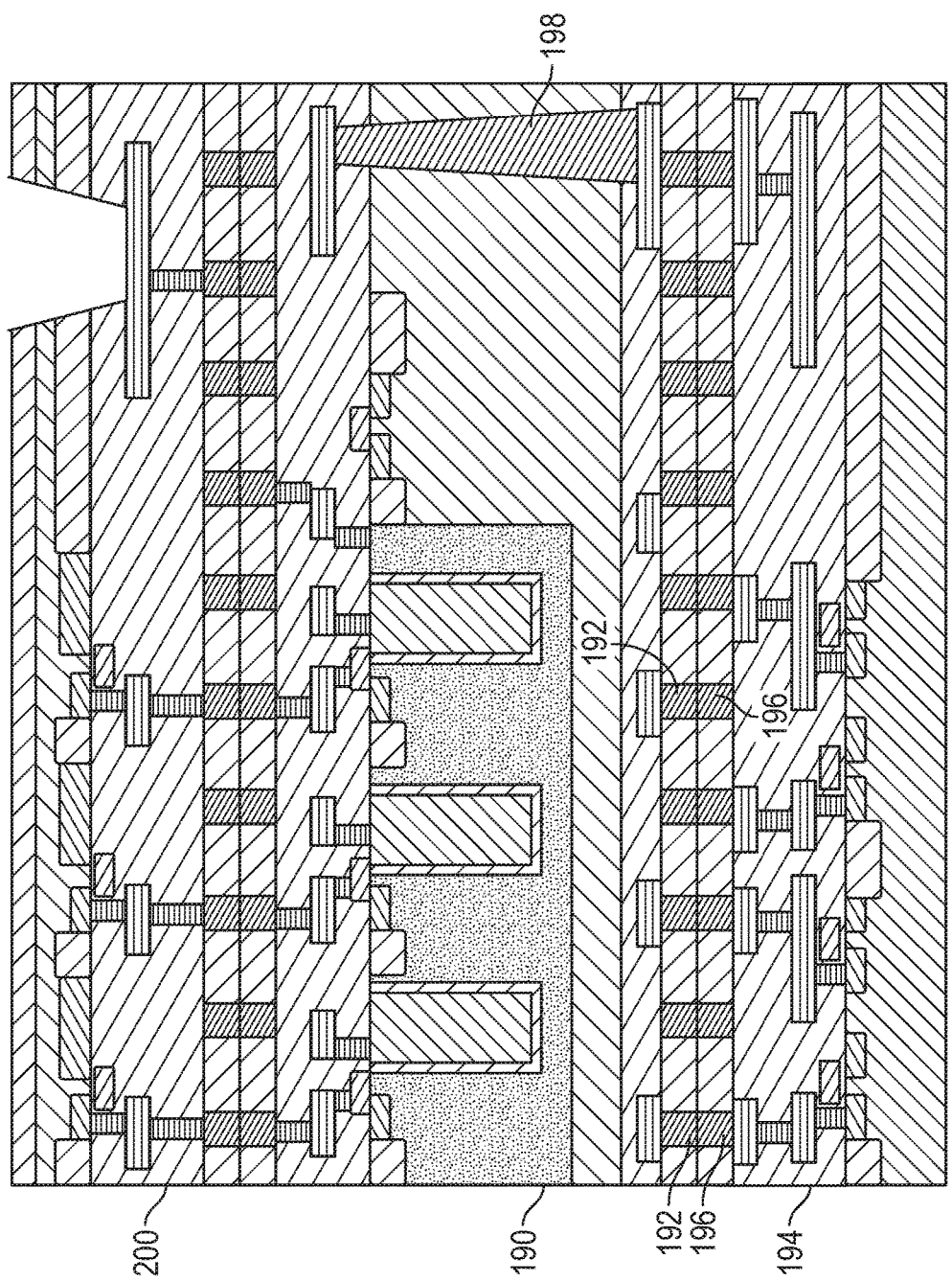
FIG. 12 is a front cross sectional view of a three die stacked image sensor with an offset through silicon via (TSV)

Referring to FIG. 12, a front cross sectional view of a three die stacked image sensor with an offset through silicon via (TSV) is illustrated. The structure of the image sensor of FIG. 12 may be the same as or similar to the structure of the image sensor described in FIG. 9 with a few differences. Unlike the image sensor of FIG. 9, the pixel device die 190 of FIG. 12 includes a third plurality of vertical die-to-die interconnects 192. As illustrated, the pixel device die is bonded to a digital signal processor die 194. In various implementations, the digital signal processor die 194 includes a fourth plurality of interconnects 196 coupled to the third plurality of interconnects. The pixel device die 190 includes a TSV 198 entirely contained therein. In various implementations, the TSV 198 may be coupled to at least one interconnect of the third plurality of interconnects 192, and in turn, may electrically couple the pixel device die with the digital signal processor die 194. In other implementations, the TSV 198 may electrically couple the photodiode die 200, the pixel device die 190, and the digital signal processor die 194 together. The TSV may be of any of the shapes and sizes as the TSVs previously described herein. In other implementations, the TSV 198 may narrow from the side of the pixel device die closest to the digital signal processor die to the side of the pixel device die closest to the photodiode die. In various implementations, and as illustrated, the TSV may be offset from the third plurality of interconnects 196. This offsetting may avoid issues with copper pumping during wafer bonding.

Figure 13:
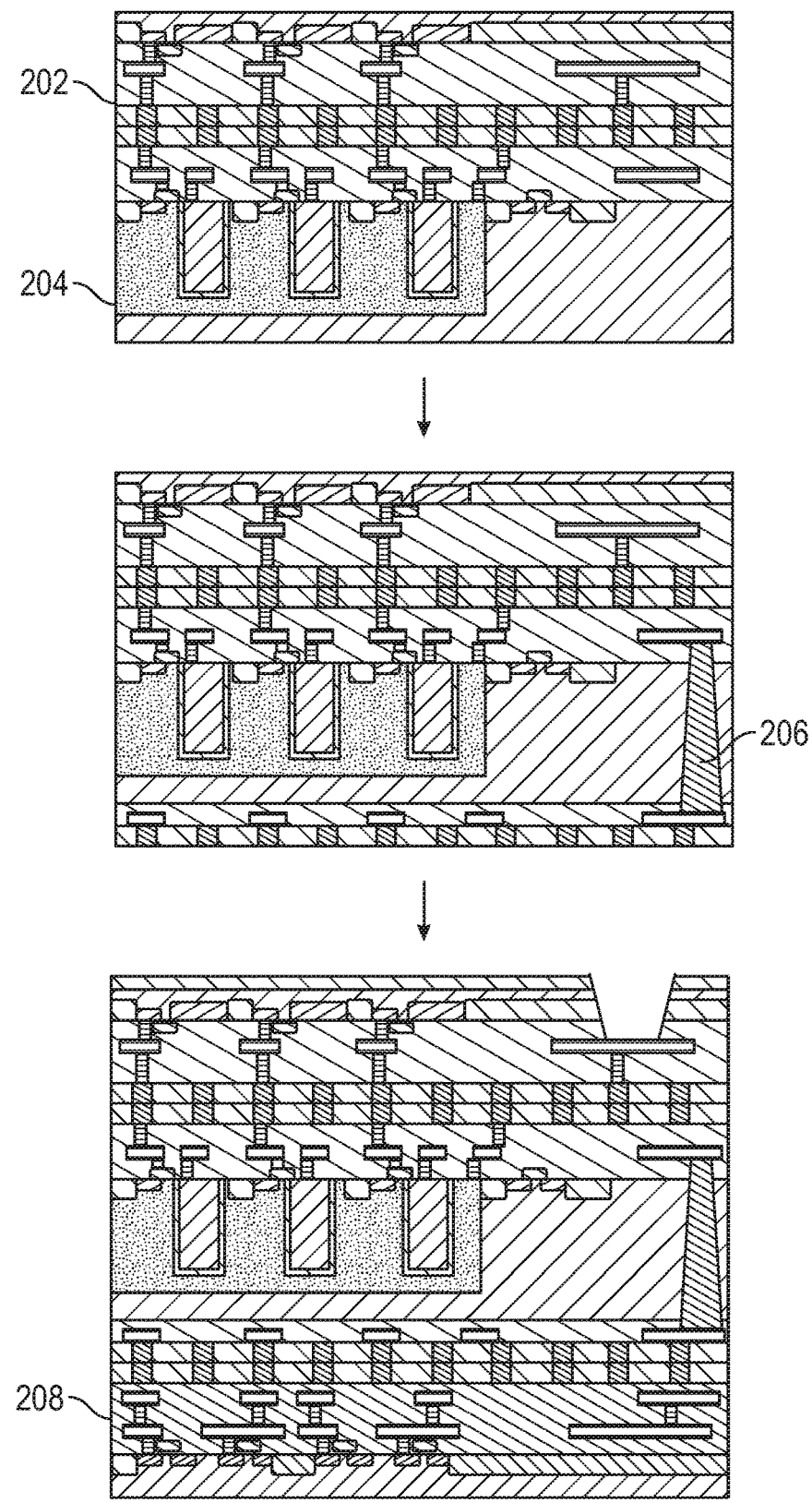
FIG. 13 illustrates a process flow for forming the image sensor of FIG. 12.

Referring to FIG. 13, a process flow for forming the image sensor of FIG. 12 is illustrated. At the beginning, a fully processed photodiode die 202 is hybrid bonded to a full thickness pixel device die 204. In various implementations, the pixel device die is only partially formed, while in other implementations the pixel device die 204 is fully formed at the time of bonding. In implementations where the pixel device die is only partially formed, the pixel device die 204 is finished processing after bonding to the photodiode die. Part of the finish processing includes forming a TSV 206 in the pixel device die. The TSV may be a formed from the backside of the pixel device die and may be positioned to be offset from all interconnects. A fully developed digital signal processor die 208 is then bonded to the pixel device die. In various implementations, the digital signal processor die 208 is hybrid bonded to the pixel device die, while in other implementations it is fusion bonded using oxides or metals.

Figure 14:
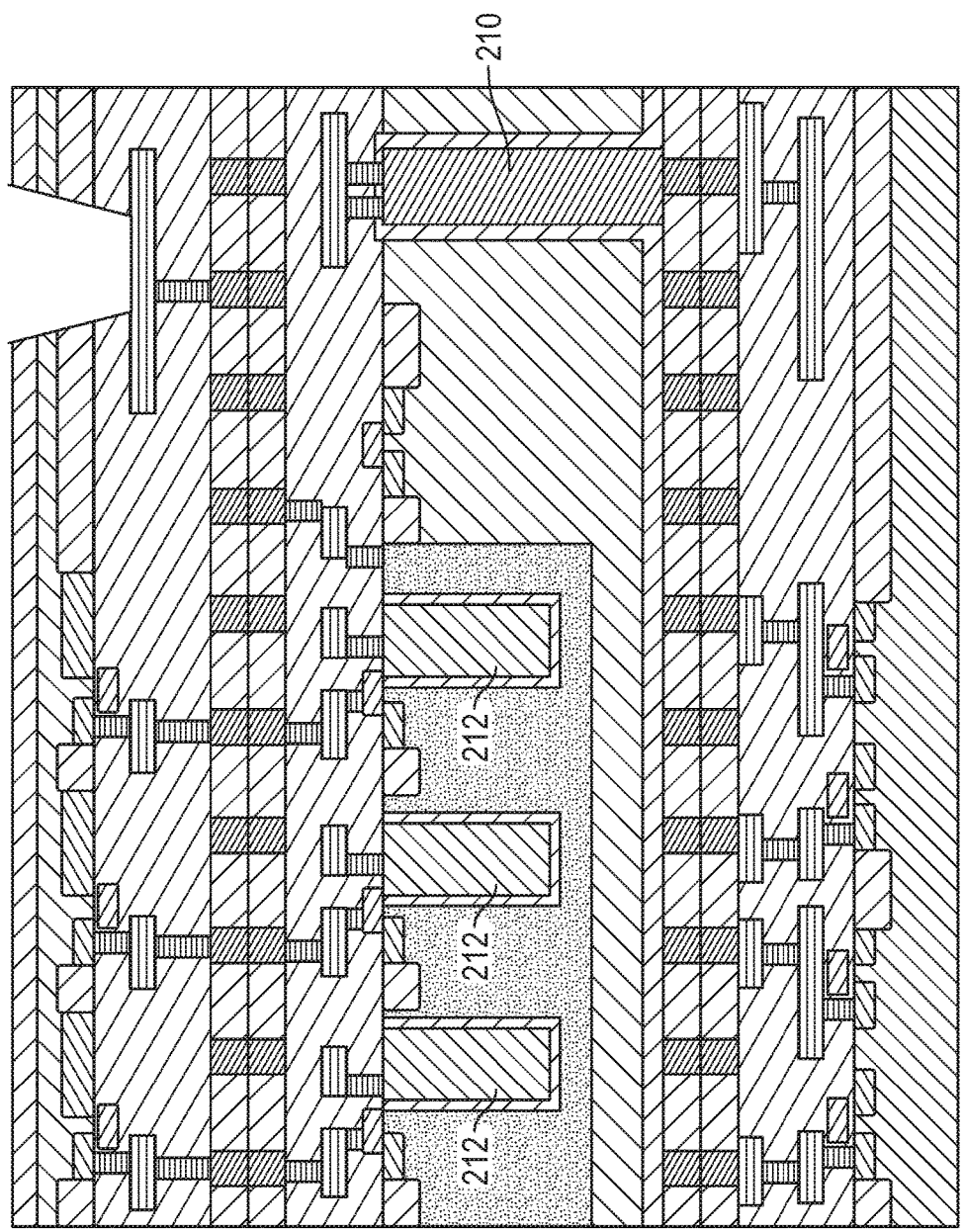
FIG. 14 is a front cross sectional view of a three die stacked image sensor with a polysilicon filled TSV.

Referring to FIG. 14, a front cross sectional view of a three die stacked image sensor with a polysilicon filled TSV is illustrated. In various implementations, the image sensor may include a polysilicon filled TSV 210. Such a TSV may be used in place of any other TSV previously disclosed in this document. Reactive ion etching (RIE) lag techniques may be implemented to obtain a depth difference between the TSV and the plurality of deep trench capacitors 212 where both the TSV and the deep trench capacitors are formed using RIE at the same time. In other implementations, these structures may be formed at different times using conventional multiple lithography steps. The TSV may, in various implementations, also have a larger diameter to permit a deeper etch than the deep trench capacitors.

In places where the description above refers to particular implementations of image sensors and implementing components, sub-components, methods and sub-methods, it should be readily apparent that a number of modifications may be made without departing from the spirit thereof and that these implementations, implementing components, sub-components, methods and sub-methods may be applied to other image sensors.

What is claimed is:

1. An image sensor comprising:
   a first die comprising an image sensor array and a first plurality of interconnects, the image sensor array comprising a plurality of photodiodes and a plurality of transfer gates; and
   a second die comprising a second plurality of interconnects and a plurality of capacitors, each capacitor selected from the group consisting of deep trench capacitors, metal-insulator-metal (MIM) capacitors, polysilicon-insulator-polysilicon (PIP) capacitors, and 3D stacked capacitors;
   wherein the first die is coupled to the second die through the first plurality of interconnects and through the second plurality of interconnects;
   wherein each capacitor comprises a total capacitance of at least 100 fF; and
   wherein no more than eight photodiodes of the plurality of photodiodes of the first die are electrically coupled with no more than four capacitors of the plurality of capacitors.

2. The image sensor of claim 1, wherein each photodiode of the first die is electrically coupled to only one capacitor of the plurality of capacitors.

3. The image sensor of claim 1, wherein each capacitor has a density of at least 25 fF/$\mu$m$^2$.

4. An image sensor comprising:
   a photodiode die comprising an image sensor array comprising a plurality of photodiodes, and a plurality of transfer gates;
   a pixel device die comprising a first side and a second side, the first side bonded to the photodiode die, the pixel device die comprising a plurality of capacitors selected from the group consisting of deep trench capacitors, MIM capacitors, PIP capacitors, and 3D stacked capacitors; and
   a digital signal processor (DSP) die bonded to the second side of the pixel device die;
   wherein a through silicon via (TSV) electrically couples the pixel device die with the DSP die; and
   wherein no more than eight photodiodes of the plurality of photodiodes of the photodiode die are electrically coupled with no more than four capacitors of the plurality of capacitors.

5. The image sensor of claim 4, wherein each photodiode of the photodiode die is electrically coupled to only one capacitor of the plurality of capacitors.

6. The image sensor of claim 4, each capacitor comprising a total capacitance of at least 100 fF.

7. The image sensor of claim 4, wherein the plurality of capacitors are deep trench capacitors and each photodiode is electrically coupled to a first deep trench capacitor for a signal value and a second deep trench capacitor for a reference value.

8. The image sensor of claim 4, wherein the plurality of capacitors are deep trench capacitors and the pixel device die further comprises a base oxide layer contacting a terminal end of each deep trench capacitor.

9. The image sensor of claim 4, wherein the plurality of capacitors are deep trench capacitors and at least a portion of the TSV is wider than each deep trench capacitor.

10. The image sensor of claim 4, wherein each capacitor has a density of at least 25 fF/μm².

11. The image sensor of claim 4, wherein the photodiode die is hybrid bonded to the pixel device die and the pixel device die is fusion bonded to the DSP die.

12. The image sensor of claim 4, wherein the photodiode die is hybrid bonded to the pixel device die and the pixel device die is hybrid bonded to the DSP die.

13. An image sensor comprising:
a photodiode die comprising an image sensor array comprising a plurality of photodiodes, and a plurality of transfer gates;
a pixel device die comprising a first side and a second side, the first side bonded to the photodiode die, the pixel device die comprising a plurality of deep trench capacitors; and
a digital signal processor (DSP) die bonded to the second side of the pixel device die;
wherein a through silicon via (TSV) electrically couples the pixel device die with the DSP die; and
wherein no more than eight photodiodes of the plurality of photodiodes of the photodiode die are electrically coupled with no more than four deep trench capacitors.

14. The image sensor of claim 13, wherein the pixel device die further comprises a base oxide layer contacting a terminal end of each deep trench capacitor.

15. The image sensor of claim 13, wherein at least a portion of the TSV is wider than each deep trench capacitor.

16. The image sensor of claim 13, wherein each capacitor has a density of at least 25 fF/μm².

17. The image sensor of claim 13, wherein the TSV is a polysilicon filled TSV.

18. The image sensor of claim 13, wherein the TSV narrows from the pixel device die to the DSP die.

19. The image sensor of claim 13, wherein the TSV widens from the pixel device die to the DSP die.

* * * * *